(12) United States Patent
Koo et al.

(10) Patent No.: US 7,815,479 B2
(45) Date of Patent: Oct. 19, 2010

(54) LUMINANCE IMPROVED ORGANIC ELECTROLUMINESCENT DEVICE

(75) Inventors: Jae-Bon Koo, Yongin (KR); Jin-Woo Park, Yongin (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 110 days.

(21) Appl. No.: 12/153,263

(22) Filed: May 15, 2008

(65) Prior Publication Data

US 2008/0220683 A1 Sep. 11, 2008

Related U.S. Application Data

(62) Division of application No. 10/683,353, filed on Oct. 14, 2003, now Pat. No. 7,391,151.

(30) Foreign Application Priority Data

Dec. 20, 2002 (KR) .............................. 2002-81856

(51) Int. Cl.
  *H05B 33/26* (2006.01)
(52) U.S. Cl. ........................................ 445/24; 313/506
(58) Field of Classification Search ................. 313/498, 313/504, 506; 445/24
  See application file for complete search history.

(56) References Cited

U.S. PATENT DOCUMENTS

| | | | |
|---|---|---|---|
| 6,515,428 B1 * | 2/2003 | Yeh et al. .................. | 315/169.3 |
| 2002/0047514 A1 | 4/2002 | Sakurai et al. | |
| 2002/0089497 A1 | 7/2002 | Yudasaka .................... | 345/204 |
| 2002/0101152 A1 | 8/2002 | Kimura ....................... | 313/505 |
| 2002/0101155 A1 | 8/2002 | Kimura | |

FOREIGN PATENT DOCUMENTS

CN  1365247  8/2002

(Continued)

OTHER PUBLICATIONS

Japanese Office Action for corresponding Japanese Patent Application No. 2003-309282 issued on Jan. 9, 2007.

(Continued)

*Primary Examiner*—Nimeshkumar D. Patel
*Assistant Examiner*—Anthony T Perry
(74) *Attorney, Agent, or Firm*—Robert E. Bushnell, Esq.

(57) ABSTRACT

An organic light emitting diode (OLED) is capable of improving light efficiency per pixel unit by forming a cathode electrode to cover an anode electrode, thereby focusing light emitted from a luminescent layer per pixel unit. The OLED comprises: a second insulating film formed on a substrate including a TFT with source/drain electrodes formed on a first insulating film; a lower electrode formed on the second insulating film and connected to one of the source/drain electrodes; a third insulating film having an opening for exposing a portion of the lower electrode; a luminescent layer formed on the lower electrode inside the opening; a groove formed to surround the luminescent layer; and an upper electrode formed on the substrate including the groove so that the upper electrode surrounds the luminescent layer. The upper electrode functions as a reflection layer for reflecting total light while light emitted from the luminescent layer is being pulled out through the substrate.

10 Claims, 5 Drawing Sheets

FOREIGN PATENT DOCUMENTS

| | | |
|---|---|---|
| JP | 2002-229482 | 8/2002 |
| JP | 2003-317960 | 11/2003 |
| KR | 2002-0055411 | 7/2002 |
| WO | WO 98/12689 | 3/1998 |
| WO | WO 98/36407 | 8/1998 |
| WO | WO 99/10862 | 3/1999 |

OTHER PUBLICATIONS

Chinese Office Action for corresponding Chinese Patent Application No. 2003101206802 issued on Jan. 26, 2007.

Certificate of Patent from the Chinese Patent Office issued in Applicant's corresponding Chinese Patent Application No. 200310120680.2 dated Mar. 18, 2009.

* cited by examiner

LUMINANCE IMPROVED ORGANIC ELECTROLUMINESCENT DEVICE

CLAIM OF PRIORITY AND CROSS-REFERENCE TO RELATED APPLICATION

This application makes reference to, incorporates the same herein, and claims all benefits accruing under 35 U.S.C. §119 from an application for OELD WITH IMPROVED BRIGHTNESS earlier filed in the Korean Intellectual Property Office on 20 Dec. 2002 and there duly assigned Serial No. 2002-81856. Furthermore, this application is a divisional of Applicants' Ser. No. 10/683,353 filed in the U.S. Patent & Trademark Office on 14 Oct. 2003 now U.S. Pat. No. 7,391,151 and assigned to the assignee of the present invention.

BACKGROUND OF THE INVENTION

1. Technical Field

The present invention relates to an active matrix flat panel display and, more particularly, to an organic light emitting diode capable of improving luminance per pixel unit by forming a cathode electrode which surrounds an organic luminescent layer, thereby focusing light per pixel unit.

2. Related Art

Generally, light efficiency of an organic light emitting diode (OLED) is largely divided into internal light efficiency and external light efficiency. The internal light efficiency out of the light efficiency depends on the photoelectric conversion efficiency of an organic luminescent layer, while the external light efficiency is characterized as light coupling efficiency and depends on the index of refraction of each layer making up the OLED. An OLED needs to improve the characteristics of a display device, including luminance, life cycle, etc. as it has a lower external light efficiency compared with a flat panel display, such as a cathode ray tube (CRT), a plasma display panel (PDP), or a field emission display (FED).

Certain problems exist in the currently used OLED. Most importantly, light emission is not satisfactory due to the escape of reflected light from the structure of the OLED. As a result, the overall luminance of the OLED is reduced, and this provides a less efficient device. Another problem with current OLED device is that its life is shortened due to the necessity to increase the driving voltage applied to it in order to compensate for the aforementioned reduced luminance.

SUMMARY OF THE INVENTION

Therefore, in order to solve the foregoing problems of the prior art, it is an object of the present invention to provide an active matrix organic light emitting diode capable of improving luminance per pixel unit.

It is another object of the present invention to provide an organic light emitting diode of such a structure that an upper electrode surrounds an organic luminescent layer to prevent loss of light emitted from the organic luminescent layer.

In order to achieve the foregoing objects, the present invention provides an organic light emitting diode comprising: lower electrodes arranged per each unit pixel region of a substrate; luminescent layers formed on the respective lower electrodes; and an upper electrode formed on the substrate; wherein the upper electrode is formed to surround the luminescent layers per each unit pixel region so that the upper electrode functions as a reflection layer for reflecting total light reflected while light emitted from the luminescent layers is being emitted through the substrate.

Furthermore, the present invention provides an organic light emitting diode comprising: a second insulating film formed on a substrate including a thin film transistor (TFT) with source/drain electrodes formed on a first insulating film; a lower electrode formed on the second insulating film and connected to any one of the source/drain electrodes; a third insulating film with an opening exposing a portion of the lower electrode; a luminescent layer formed on the lower electrode inside the opening; a groove formed to surround the luminescent layer; and an upper electrode formed on the substrate including the groove so that the upper electrode surrounds the luminescent layer.

Furthermore, the present invention provides a method for fabricating an organic light emitting diode comprising the steps of: providing a substrate including a TFT with source/drain electrodes formed on a first insulating film; forming a second insulating film on the substrate; forming a lower electrode connected to one of the source/drain electrodes on the second insulating film; forming a third insulating film on the substrate; forming an opening for exposing a portion of the lower electrode and forming a groove surrounding the lower electrode at the same time by etching the third insulating film; forming a luminescent layer on the lower electrode inside the opening; and forming an upper electrode on the substrate including the groove so that the upper electrode surrounds the luminescent layer.

Preferably, the groove is formed over the second and third insulating films by etching the third insulating film as well as the second insulating film, or the groove is formed over the first to third insulating films by etching the third insulating film together with the first and second insulating films.

The method further comprises the step of forming a via hole for connecting one of the source/drain electrode and the lower electrode by etching the second insulating film after the step of forming the second insulating film, and the groove is formed over the second and third insulating films by etching a portion of the second insulating film corresponding to the groove when forming the via hole.

The method further comprises the step of forming a contact hole by etching the first insulating film, and forming a via hole for connecting one of the source/drain electrodes and the lower electrode by etching the second insulating film before and after the step of forming the second insulating film respectively, and the groove is formed over the first to third insulating films by etching a portion of the first insulating film corresponding to the groove during formation of the contact hole, and by etching a portion of the second insulating film corresponding to the groove during formation of the via hole.

Preferably, the first insulating film is an interlayer insulating film, the second insulating film is a passivation film, and the third insulating film is a pixel defining layer. The upper electrode is, preferably, formed to surround the lower electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
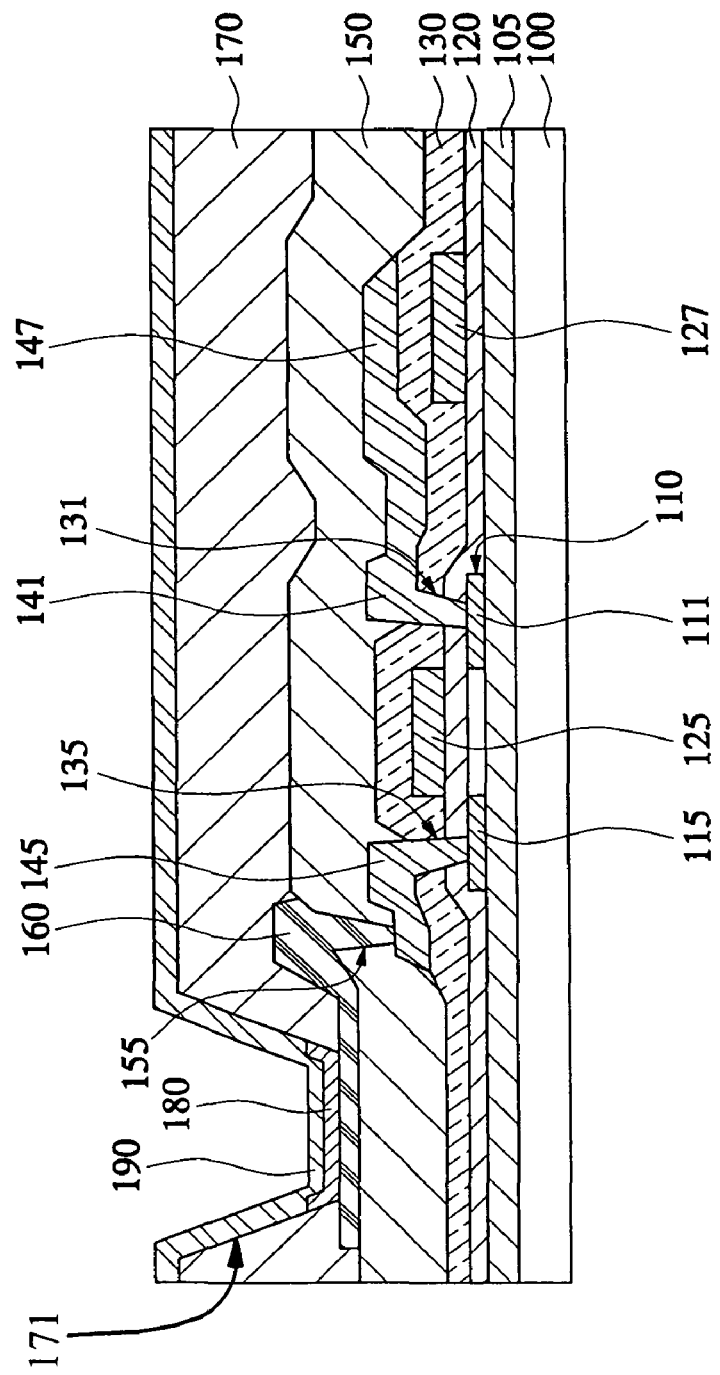
FIG. 1 is a cross sectional view of an active matrix organic light emitting diode.

The present invention will now be described in detail in connection with preferred embodiments with reference to the accompanying drawings. For reference, like reference characters will be used to designate corresponding parts throughout the several views.

FIG. 1 is a cross sectional view of an active matrix organic light emitting diode (OLED).

Referring to FIG. 1, a buffer layer 105 is formed on an insulating substrate 100, and a thin film transistor and a capacitor are formed on the buffer layer 105. The thin film transistor comprises a semiconductor layer 110 which includes source/drain regions 111 and 115, a gate electrode 125 formed on a gate insulating film 120, and source/drain electrodes 141 and 145 formed on an interlayer insulating film 130 and connected to the source/drain regions 111 and 115 through contact holes 131 and 135. The capacitor comprises first electrode 127 formed of the same material as the gate electrode 125 and formed on the gate insulating film 120, and second electrode 147 formed on the interlayer insulating film 130 connected to one of the source/drain electrodes 141 and 145, e.g., the source electrode 141.

A via hole 155 for exposing a portion of one of the source/drain electrodes, e.g., the drain electrode 145, is formed on a passivation film 150 by patterning the passivation film 150 after forming the passivation film 150 on the substrate 100. An anode electrode 160 is formed as a lower electrode connected to the drain electrode 145 through via hole 155 by patterning a transparent conductive film, such as an ITO film, after depositing the transparent conductive film.

A pixel defining layer film 170 is formed on the substrate 100 and etched to form an opening 171 exposing a portion of the anode electrode 160. A cathode electrode 190 as an upper electrode is formed over the substrate 100 after forming an organic luminescent layer 180 on the anode electrode 160 inside the opening 171.

In the OLED having the aforementioned structure, only about ¼ of light emitted from the organic luminescent layer 180 is pulled out through the substrate 100 primarily due to the fact that total light reflected by a large difference of index of refraction is wave-guided so as to be slipped out of the side on an interface between a material having a high index of refraction, such as an ITO material (that is, the anode electrode 160), and a material having a low index of refraction, such as a passivation film or a glass substrate.

Thus, the aforementioned OLED has problems in that the luminance of the device is lowered as the external light efficiency is being lowered, and shortening of the life cycle is caused since the driving voltage is raised to generate a desired luminance.

Figure 2:
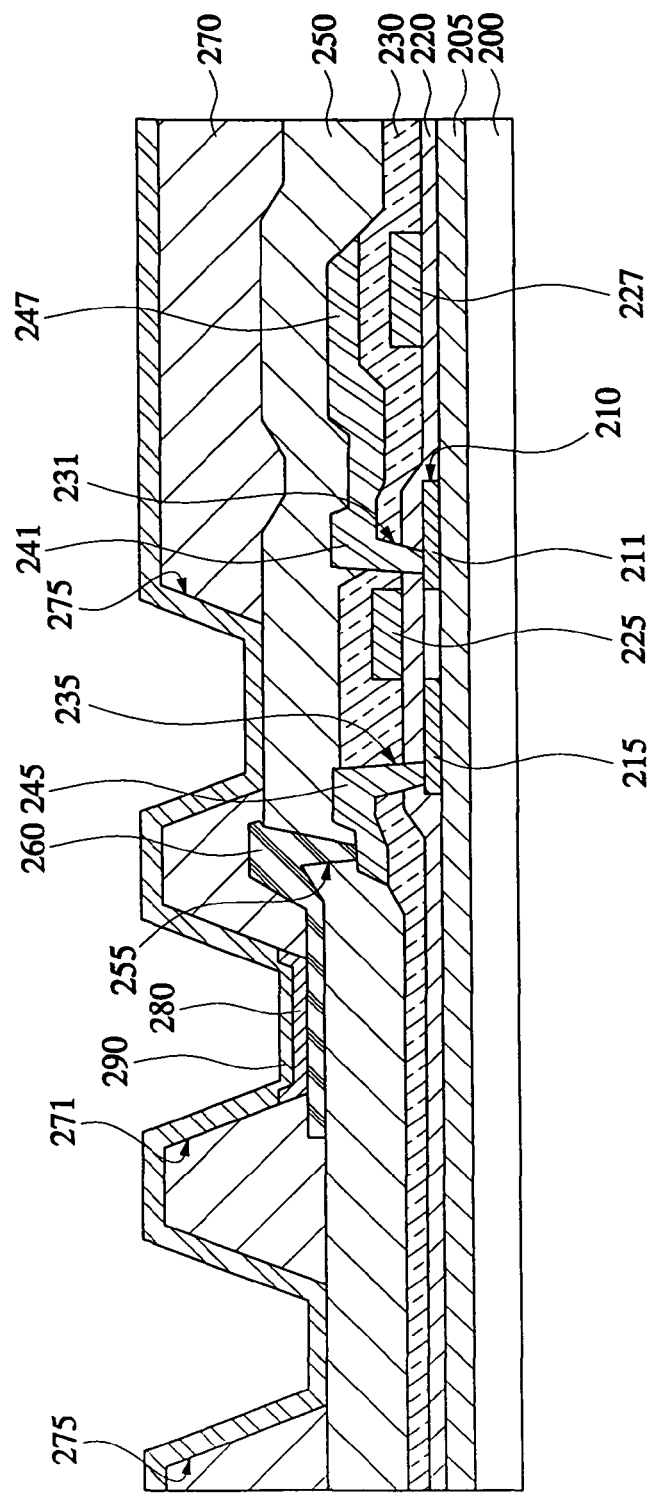
FIG. 2 is a cross sectional view of an organic light emitting diode according to a first preferred embodiment of the present invention.

FIG. 2 is a cross sectional view of an active matrix organic light emitting diode according to a first preferred embodiment of the present invention.

Referring to FIG. 2, a buffer layer 205 is formed on an insulating substrate 200, a semiconductor layer 210 with source/drain regions 211 and 215 is formed on the buffer layer 205, a gate electrode 225 and a lower electrode 227 of a capacitor are formed on a gate insulating film 220, and source/drain electrodes 241 and 245 connected to the source/drain regions 211 and 215, respectively, through contact holes 231 and 235, respectively, and an upper electrode of the capacitor 247, are formed on an interlayer insulating film 230.

A via hole 255 for exposing a portion of one of the source/drain electrodes 241 and 245 (e.g., the drain electrode 245) is formed on a passivation film 250 after forming the passivation film 250 on the substrate 200. An anode electrode 260 is formed as a lower electrode connected to the drain electrode 245 through the via hole 255 by patterning a transparent conductive film (such as an ITO film) after depositing the transparent conductive film on the substrate 200.

An opening 271 and a groove 275 surrounding the anode electrode 260 are formed at the same time by etching a pixel defining layer 270 after depositing the pixel defining layer 270 on the substrate 200. An organic luminescent layer 280 is formed on the anode electrode 260 inside the opening 271, and a cathode electrode 290 as an upper electrode is formed over the substrate 200.

The cathode electrode 290 is formed so as to completely cover the anode electrode 260 and the organic luminescent layer 280 per pixel unit since the cathode electrode 290 is formed over the substrate 200, including the groove 275. In other words, the cathode electrode 290 has a structure in which the anode electrode 260 and the organic luminescent layer 280 are surrounded per pixel unit. Therefore, the cathode electrode 290 not only functions as the upper electrode, but also serves as a reflection layer for pulling out the reflected light by reflecting total light reflected as a result of a difference in indices of refraction. A material having a high reflectivity, such as Al, is preferably used since the cathode electrode of the present invention functions as both an electrode and a reflection layer.

Therefore, loss of light due to wave-guided slippage out of the side of structure is prevented since total light is reflected from the side of cathode electrode 290 while light emitted from the organic luminescent layer 280 of the present invention is being transmitted from the anode electrode 260 (formed of an ITO having a high index of refraction) to a material having a low index of refraction (namely, the passivation film 250, the interlayer insulating film 230, or the glass substrate 200 under the anode electrode 260). Luminance per pixel unit can be improved by taking out the light to the substrate, with light emitted from the organic luminescent layer 280 being limited to each pixel unit.

In the first preferred embodiment of the present invention, an additional mask process is not required since the groove 275 surrounding the anode electrode 260 and the organic luminescent layer 280 is formed simultaneously with formation of the opening 271 on the pixel defining layer 270.

Figure 3:
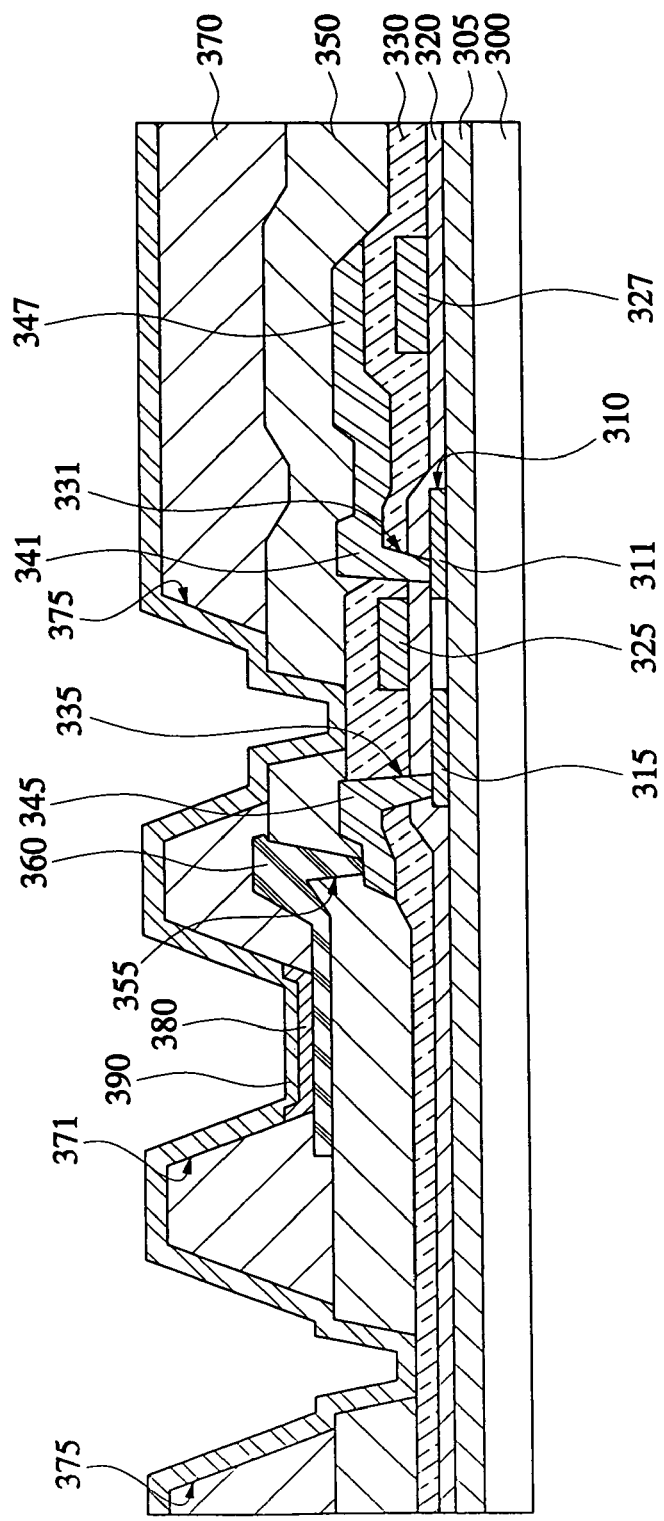
FIG. 3 is a cross sectional view of an organic light emitting diode according to a second preferred embodiment of the present invention.

FIG. 3 is a cross sectional view of an organic light emitting diode according to a second preferred embodiment of the present invention.

The organic light emitting diode according to this second preferred embodiment has the same structure as the organic light emitting diode according to the first preferred embodiment except that a groove 375 is formed in both pixel defining layer 370 and passivation film 350 so as to surround an anode electrode 360 and an organic luminescent layer 380 in the organic light emitting diode according to the second preferred embodiment. Furthermore, the groove 375 can also be formed by simultaneously etching the pixel defining layer 370 and the passivation film 350 when forming an opening 371 by etching the pixel defining layer 370.

Further considering the second preferred embodiment of FIG. 3, the groove 375 having a structure which surrounds the anode electrode 360 and the organic luminescent layer 380 in a pixel unit can be finally formed over the passivation film 350 and the pixel defining layer 370 by secondarily forming a groove by etching the pixel defining layer 370 so that the primarily formed groove is exposed when forming the opening 371 after primarily forming a groove by etching the passivation film 350 when forming a via hole 355.

The second preferred embodiment of the present invention does not require an additional mask process for forming the groove 375 because the passivation film 350 and the pixel defining layer 370 are etched when forming the via hole 355 and opening part 371, thereby forming the groove 375.

Figure 4:
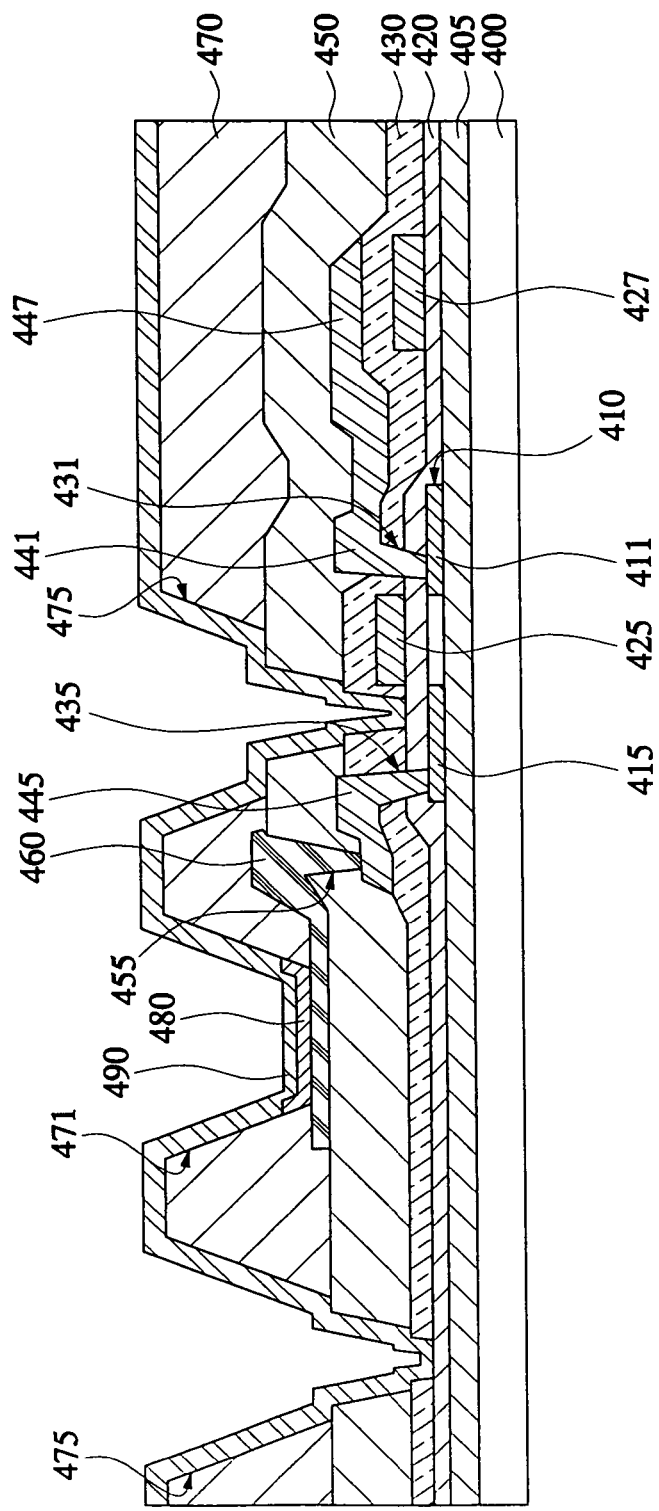
FIG. 4 is a cross sectional view of an organic light emitting diode according to a third preferred embodiment of the present invention.

FIG. 4 is a cross sectional view of an organic light emitting diode according to a third preferred embodiment of the present invention.

The organic light emitting diode according to this third preferred embodiment has the same structure as in the first and second preferred embodiments of the present invention except that a groove 475 is formed in pixel defining layer 470, passivation film 450 and interlayer insulating film 430 so as to surround an anode electrode 460 and an organic luminescent layer 480.

Etching the pixel defining layer 470, the passivation film 450 and the interlayer insulating film 430 when forming an opening 471 by etching the pixel defining layer 470 can form the groove 475. On the other hand, the groove 475 having a structure which surrounds the anode electrode 460 and the organic luminescent layer 480 per pixel unit can be finally formed over the interlayer insulating film 430, the passivation film 450 and the pixel defining layer 470 by primarily forming a groove by etching the interlayer insulating film 430 when forming contact holes 431 and 435, secondarily forming a groove by etching the passivation film 450 so that the primarily formed groove is exposed when forming a via hole 455, and then thirdly forming a groove by etching the pixel defining layer 470 so that the secondarily formed groove is exposed when forming the opening 471.

The third preferred embodiment of the present invention does not require an additional mask process for forming the groove 475 because the interlayer insulating film 430, the passivation film 450 and the pixel defining layer 470 are etched when forming the contact holes 431 and 435, the via hole 455 and the opening 471, thereby forming the groove 475.

The groove should be formed at a proper position considering parasitic capacitance generated between electrodes adjacent to the cathode electrode formed on the groove in case of forming a groove for surrounding the anode electrode and the organic luminescent layer over the pixel defining layer, the passivation film and the interlayer insulating film as in the third preferred embodiment of the present invention.

Figure 5:
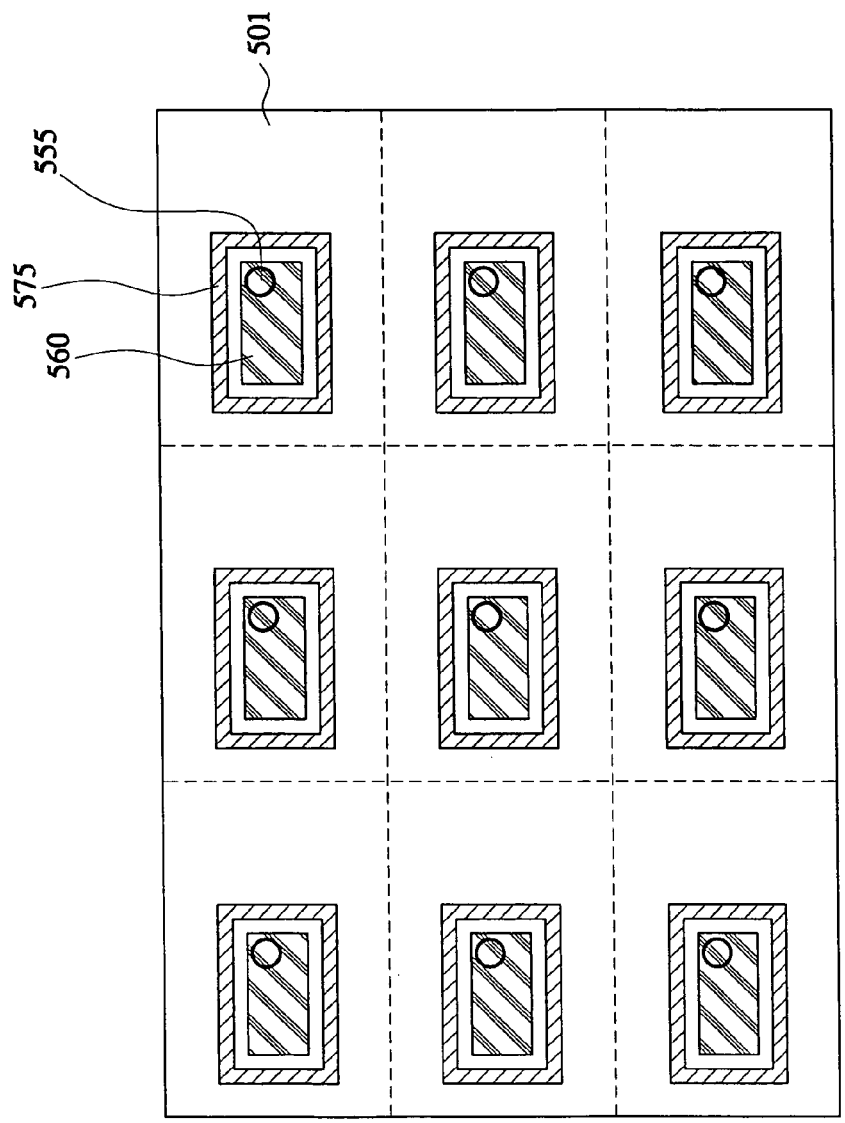
FIG. 5 is a planar structural diagram of the organic light emitting diode according to the preferred embodiments of the present invention.

FIG. 5 is a planar structural diagram of an organic light emitting diode according to the preferred embodiments of the present invention.

Referring to FIG. 5, an organic light emitting diode according to the preferred embodiments of the present invention comprises plural pixel unit regions 501. An anode electrode 560 is formed on each of the pixel unit regions 501 and is connected to one electrode of the source/drain electrodes (e.g., the drain electrode through a via hole 555). A groove 575 surrounds the anode electrode 560.

The cathode electrode has a structure which surrounds the anode electrode 560 and the luminescent layer formed on the anode electrode 560 for each of the pixel unit regions 501 if a cathode electrode is formed on the substrate, including the groove 575 formed to surround the anode electrode 560, as described in the first, second and third preferred embodiments of FIG. 2, FIG. 3 and FIG. 4, respectively.

Therefore, in the organic light emitting diode of the present invention, total light reflected during transmission from an anode electrode formed of an ITO having a high index of refraction to a passivation film or a glass substrate having a low index of refraction is reflected by a cathode electrode formed in a structure which surrounds the anode electrode and the organic luminescent layer when light emitted from an organic luminescent layer is pulled out through the glass substrate. Therefore, light coupling efficiency is increased, and luminance is improved per pixel unit by limiting light emitted from the organic luminescent layer by means of the cathode electrode per pixel unit and reflecting the total light.

Efficiency is greatly increased by collecting a photon at a place close to the organic luminescent layer, thereby imparting straightness or uniformity so as to prevent total light reflected from being reduced due to wave guiding while light is being transmitted from a medium having a high index of refraction to a medium having a low index of refraction. In the latter regard, the most effective proper position for efficiency increase is an interface which is close to the luminescent layer, and in which the difference between indices of refraction is severe. The light emitted from the organic luminescent layer per pixel unit can be focused by forming a groove to surround an anode electrode and the organic luminescent layer, and by forming a cathode electrode to surround the anode electrode and the organic luminescent layer per pixel unit.

The organic light emitting diode according to the preferred embodiments of the present invention as just described not only prevents the total reflected light from being reduced due to wave-guiding by forming the cathode electrode in such a structure that the organic luminescent layer is surrounded by pixel units, but also improves the luminance by limiting light emitted from the organic luminescent layer with pixel units, thereby increasing light coupling efficiency. Therefore, the organic light emitting diode according to the preferred embodiments of the present invention improves the life cycle of the device by relatively improving luminance under the same driving conditions so that additional driving voltage need not be applied to the device.

Furthermore, the organic light emitting diode according to the preferred embodiments of the present invention has the advantage of simplifying the fabrication process by forming a groove without use of an additional mask process.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A method for fabricating an organic light emitting diode, comprising the steps of:
   providing a substrate including a TFT with source and drain electrodes formed on a first insulating film;
   forming a second insulating film on the substrate;
   forming a lower electrode on the second insulating film and connecting the lower electrode to one of the source and drain electrodes;
   forming a third insulating film on the substrate;

forming an opening for exposing a portion of the lower electrode and simultaneously forming a groove surrounding the lower electrode by etching the third insulating film, the groove being formed directly above at least one of the source and drain electrodes of the TFT;

forming a luminescent layer on the lower electrode inside the opening; and forming an upper electrode on the substrate including the groove so that the upper electrode surrounds the luminescent layer.

2. The method for fabricating an organic light emitting diode according to claim 1, wherein the groove is formed in the second and third insulating films by etching the third insulating film as well as the second insulating film when forming the groove.

3. The method for fabricating an organic light emitting diode according to claim 1, further comprising the step of forming a via hole for connecting one of the source and drain electrodes and the lower electrode by etching the second insulating film after the step of forming the second insulating film on the substrate.

4. The method for fabricating an organic light emitting diode according to claim 3, wherein the groove is formed in the second and third insulating films by etching a portion of the second insulating film corresponding to the groove when forming the via hole.

5. The method for fabricating an organic light emitting diode according to claim 1, wherein the groove is formed in the first, second and third insulating films by etching the third insulating film together with the first and second insulating films when forming the groove.

6. The method for fabricating an organic light emitting diode according to claim 1, further comprising the steps of forming a contact hole by etching the first insulating film before forming the second insulting film, and forming a via hole for connecting one of the source and drain electrodes and the lower electrode by etching the second insulating film after forming the second insulating film.

7. The method for fabricating an organic light emitting diode according to claim 6, wherein the groove is formed in the first, second and third insulating films by etching a portion of the first insulating film corresponding to the groove during formation of the contact hole and etching a portion of the second insulating film corresponding to the groove during formation of the via hole.

8. The method for fabricating an organic light emitting diode according to claim 1, wherein the first insulating film is an interlayer insulating film.

9. The method for fabricating an organic light emitting diode according to claim 8, wherein the second insulating film is a passivation film.

10. The method for fabricating an organic light emitting diode according to claim 9, wherein the third insulating film is a pixel defining layer.

* * * * *